(12) United States Patent
Colbert et al.

(10) Patent No.: US 7,517,230 B2
(45) Date of Patent: Apr. 14, 2009

(54) CUSTOMIZABLE BACKER FOR ACHIEVING CONSISTENT LOADING AND ENGAGEMENT OF ARRAY PACKAGE CONNECTIONS

(75) Inventors: John Lee Colbert, Byron, MN (US); Mark Kenneth Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/131,176

(22) Filed: Jun. 2, 2008

(65) Prior Publication Data

US 2008/0233771 A1    Sep. 25, 2008

Related U.S. Application Data

(63) Continuation of application No. 11/456,111, filed on Jul. 7, 2006, now Pat. No. 7,399,185.

(51) Int. Cl.
*H01R 12/00* (2006.01)
(52) U.S. Cl. .......................................................... 439/73
(58) Field of Classification Search .................. 439/73, 439/66, 74, 71
See application file for complete search history.

(56) References Cited

U.S. PATENT DOCUMENTS

| 5,528,462 | A  | 6/1996  | Pendse |
|---|---|---|---|
| 6,386,890 | B1 | 5/2002  | Bhatt et al. |
| 6,743,026 | B1 | 6/2004  | Brodsky |
| 2002/0179331 | A1 | 12/2002 | Brodsky et al. |
| 2003/0116351 | A1 | 6/2003  | Brodsky et al. |
| 2003/0192180 | A1 | 10/2003 | Colbert et al. |
| 2004/0088121 | A1 | 5/2004  | Colbert et al. |
| 2005/0064740 | A1 | 3/2005  | Brodsky et al. |
| 2005/0109534 | A1 | 5/2005  | Chengalva et al. |

*Primary Examiner*—Neil Abrams
*Assistant Examiner*—Phuong Nguyen
(74) *Attorney, Agent, or Firm*—Rabin & Berdo

(57) ABSTRACT

An electrical contact assembly includes a first module (21a, 21b, 22) having a first set of electrical contacts, a second module (10) having a second set of electrical contacts, a shape generating module (32, 34, 36), and a clamping arrangement (24, 25, 26, 27, 28, 29) for clamping the first, second and shape generating modules together. The shape generating module (32, 34, 36) imparts a desired shape to the second module (10) for urging the second set of electrical contacts toward the first set of electrical contacts, such that clamping the modules together results in a positive contact force between the first and second sets of electrical contacts that is substantially uniform across the sets of electrical contacts. The shape generating module includes a first insulating layer (34), a second insulating layer (32) and a shape producing layer (36) disposed between the first and second insulating layers. The shape producing layer (36) includes an adhesive that flows and cures upon application of a heat treatment to produce the desired shape.

9 Claims, 5 Drawing Sheets

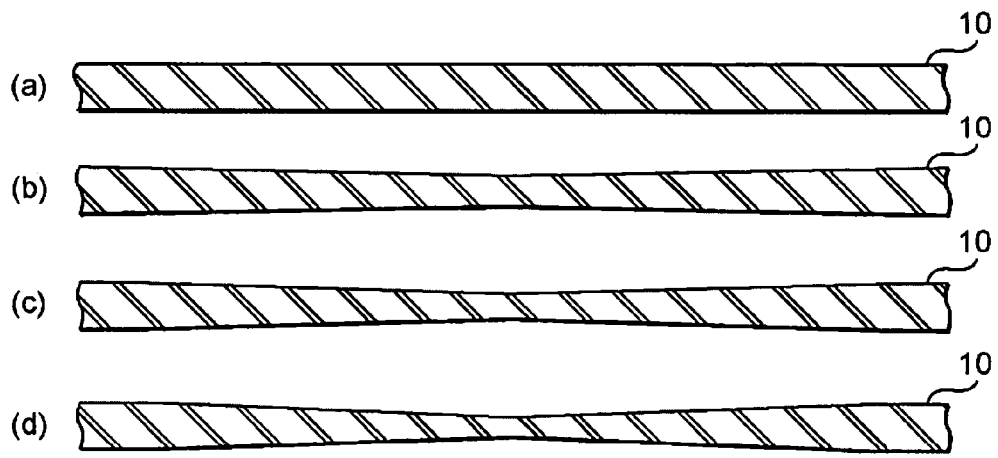
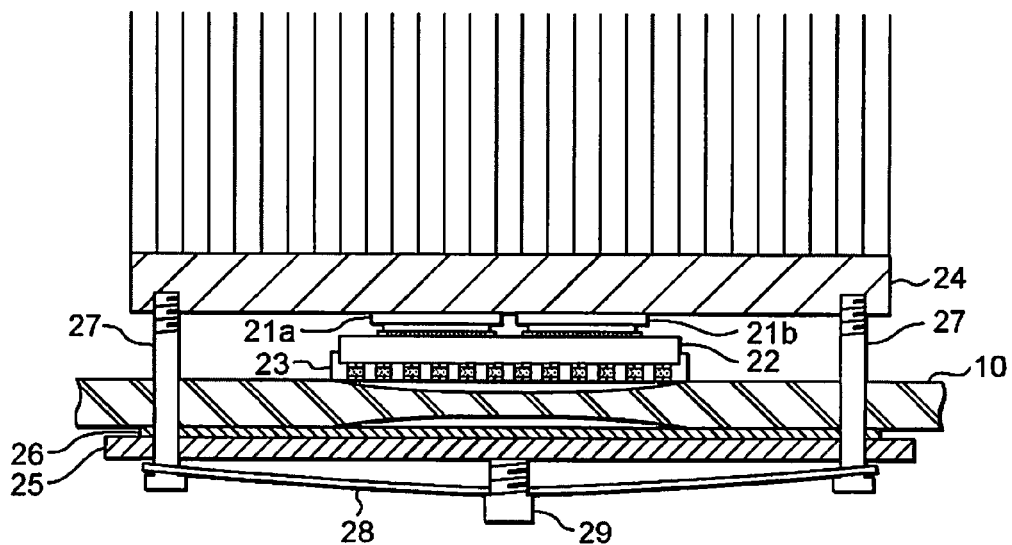

CUSTOMIZABLE BACKER FOR ACHIEVING CONSISTENT LOADING AND ENGAGEMENT OF ARRAY PACKAGE CONNECTIONS

This is a Continuation of U.S. application Ser. No. 11/456,111, filed Jul. 7, 2006, and allowed on May 15, 2008, the subject matter of which is incorporated herein by reference.

BACKGROUND OF THE INVENTION

1. Field of the Invention

The invention relates to an apparatus and method for mounting multi-chip land grid array modules to printed wiring boards, and specifically to a customizable backer for achieving consistent loading and engagement of the array package connections.

2. Background Information

Land grid array (LGA) connectors are used in many electronic applications to create mechanically loaded electrical connections between contact features (i.e., pads) present on printed wiring boards (PWB's) and those on mating chip modules (i.e., one or more semiconductor chips mounted on a carrier substrate). LGA connector technologies typically must operate under a relatively tight range of mechanical loading conditions to ensure that individual contacts in the array achieve consistent interconnection mating loads for high initial yields at the time of assembly and guaranteed long term field reliability. The tight tolerance of loading required for these LGA connector technologies is a direct consequence of limited mechanical elastic compliance that most individual LGA contact spring members possess within the land grid array connector body. As a result of this limited mechanical contact compliance, mating surfaces of PWB's, chip modules, and all mechanical hardware used in the stacking and loading configuration of these connectors in actual applications must have precision mechanical tolerances, and an aggregate high degree of mating surface coplanarity in order to facilitate a tight distribution of individual contact loads sufficient to guarantee high contact reliability. Unfortunately, although the machined mechanical hardware used to load LGA connectors can be made to extremely high precision tolerances (i.e., very flat and very uniform thickness), the same cannot be said for the conventional PWB's and chip modules included in the connector stack. PWB's and modules always have significant surface variations and thickness variations that result from process conditions inherent to their fabrication and from unique wiring and via density differences within them that can alter their thicknesses, shapes, or the surface topographies of their respective mating LGA contact/contact pad surfaces. These PWB and chip module shape variations can produce significant LGA contact load non-uniformities (both high and low loading conditions) that ultimately result in a number of problematic post assembly conditions, including high initial yield loss of components and the potential for latent field defects including module cracking phenomena, contact intermittency, and gradual loss of complete electrical continuity of individual contact members due to occurrence of fretting corrosion.

With respect to these issues, various approaches have recently been developed and used (circa 1999 to the present) to more tightly control LGA contact load distributions, and to compensate for board and module carrier thickness, shape, and topographic variations. (See, for example, Brodsky et al., U.S. Patent Application Publication No. 2004/0188135, Hoffmeyer, U.S. Pat. No. 6,711,026, Torok et al., U.S. Pat. No. 6,485,411, and Sinha et al., U.S. Pat. No. 6,475,011, all assigned to IBM Corporation). These methods include mechanical hardware and load designs that drive in phase shape changes of the stack of hardware under applied loading conditions, and the addition of various design elements that reduce the amount of intrinsic shape, thickness, and topographic variation of actual module and board array interconnection surfaces.

One approach of relevance to the present application is disclosed in Corbin, Jr. et al., U.S. Pat. No. 6,921,272. The apparatus in Corbin Jr. et al. uses an insulating backer plate which compensates for PWB thickness variation (the major contributor to LGA contact load non-uniformities, see FIGS. 1 and 2 of this application). This backer plate consists of a series of concentric overlying layers of Kapton film that are adhered to a molded backer plate made of an electrically insulating material. When this backer plate structure is added to the stack of mechanical components that load the LGA connector system, the backer structure fills in the backside "dish" present on PWB LGA site such that the array site of the board can be mechanically biased towards the intended LGA connector to present a more planar surface to the connector system. Although successfully used in various applications, the backer plate structure of Corbin, Jr. et al. has several limitations for LGA load control. The principal limitation is that this structure must be tailored in advance to an anticipated or relatively narrow measured range of actual PWB thickness variations for a given application. This lack of flexibility can lead to various problems which must be examined with continued scrutiny and inspection in a manufacturing environment. For example, if an improperly selected backer shape is used, or if PWB thickness variation exceeds that of the intended backer plate shape design, or if the amount of board dishing changes over time due to PWB fabrication process drift, some of the LGA interconnect reliability problems referred to above can arise after assembly. Furthermore, if problems are encountered during inspection, raw PWB shape function sorting would have to be exercised prior to assembly, and could result in significant yield losses and added costs, particularly on complex multi-layer, thick cross section boards that facilitate the LGA interconnection of large glass ceramic multi-chip modules, such as those used in supercomputer systems.

SUMMARY OF THE INVENTION

It is, therefore, a principle object of this invention to provide a customizable backer for achieving consistent loading and engagement of multi-chip array package connections.

It is another object of the invention to provide a customizable backer for use in mounting multi-chip land grid array modules that solves the above mentioned problems.

These and other objects of the present invention are accomplished by the customizable backer for use in mounting multi-chip land grid array modules that is disclosed herein.

In a first aspect of the invention, an electrical contact assembly includes a first module having a first set of electrical contacts, a second module having a second set of electrical contacts aligned with the first set of electrical contacts, a shape generating module, and a clamping arrangement arranged to clamp the first module, the second module and the shape generating module together. The shape generating module is arranged to impart a desired shape to the second module for urging the second set of electrical contacts toward the first set of electrical contacts, such that clamping the modules together results in a positive contact force between the first and second sets of electrical contacts that is substantially uniform across the sets of electrical contacts. In a preferred embodiment, the shape generating module includes a first insulating layer, a second insulating layer and a shape producing layer disposed between the first and second insulating layers. Preferably, the shape producing layer includes an adhesive that flows and cures upon application of a heat treatment to produce the desired shape. Preferably, the clamping arrangement includes a stiffening surface arranged such that the shape generating module is disposed between the stiffening surface and the second module. The first and second sets of electrical contacts may be land grid arrays, in which case the assembly further includes a land grid interposer between the first and second modules.

In another aspect of the invention, a method for achieving substantially uniform contact force in an electrical contact assembly is provided. The method includes arranging a first set of electrical contacts in opposition to a second set of electrical contacts to provide an electrical contact arrangement, arranging a shape generating component proximate to the electrical contact arrangement, applying a heat treatment to the shape generating component to cause the shape generating component to assume a desired shape, and clamping the shape generating component having the desired shape toward the electrical contact arrangement, thereby shaping one set of electrical contacts in the direction of the other set of electrical contacts to provide a positive contact force between the first and second sets of electrical contacts that is substantially uniform across the sets of electrical contacts. As described above, the shape generating component preferably includes a first insulating layer, a second insulating layer and a shape producing layer disposed between the first and second insulating layers. Preferably, the shape producing layer includes an adhesive that flows and cures upon application of a heat treatment to produce the desired shape. The heat treatment is performed at a relatively low temperature, preferably in the range from 80° C. to 150° C.

In a further aspect of the invention, a multi-chip module assembly includes a layered assembly having a multi-chip module, a printed wiring board and a land grid array interconnect disposed between them, where the multi-chip module, the printed wiring board and the land grid array interconnect have mating sets of electrical contacts. The module assembly further includes means for clamping the layered assembly together; and means for producing a desired shape in the printed wiring board such that clamping the layered assembly together results in a positive contact force between the mating sets of electrical contacts that is substantially uniform across the sets of electrical contacts. In a preferred embodiment, the means for producing a shape includes a first insulating layer, a second insulating layer and a shape producing layer disposed between the first and second insulating layers, where the shape producing layer produces the desired shape upon application of a heat treatment. Preferably, the shape producing layer includes an adhesive that flows and cures upon application of the heat treatment to produce the desired shape. Preferably, the means for clamping includes a means for stiffening arranged such that the means for producing the desired shape is disposed between the means for stiffening and the layered assembly.

BRIEF DESCRIPTION OF THE DRAWINGS

FIGS. 1(a)-1(d) illustrate schematically a range of thickness variations occurring on a printed wiring board (PWB) at a land grid array (LGA) site.

FIG. 2 illustrates the effect of a significant PWB thickness variation on a typical LGA load configuration.

DETAILED DESCRIPTION OF THE PREFERRED EMBODIMENTS

Figure 3:
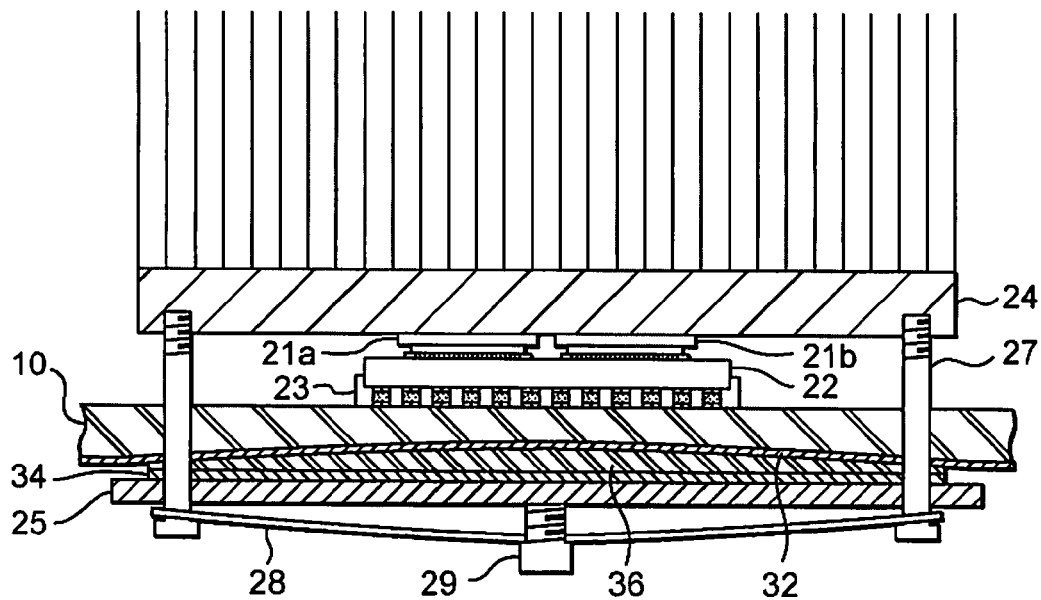
FIG. 3 illustrates the LGA load configuration of FIG. 2 with the addition of a customizable backer structure according to the present invention.

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

The present invention is directed to an apparatus and method for mounting multi-chip land grid array modules to printed wiring boards using a customizable backer for achieving consistent loading and engagement of the array package connections.

FIGS. 1(a)-1(d) illustrate schematically a range of thickness variations that might occur in PWB 10 in the vicinity of an LGA site, progressing from essentially no thickness variation in the case of FIG. 1(a) to a significant variation in the case of FIG. 1(d). FIG. 2 illustrates schematically the effect of a significant PWB variation at the LGA site on a typical LGA load configuration, which is designed to apply a uniform load to the LGA connections. In the exemplary LGA configuration shown, semiconductor chips 21a and 21b are mounted on carrier substrate 22 to form an LGA module that has an array of contact pads (not shown) on the lower surface that are electrically connected to circuit elements on the chips. The upper surface of PWB 10 has an array of contact pads (not shown) that are aligned with those on the carrier substrate 22. Electrical connection of the pads on the carrier substrate 22 to the matching pads on the upper surface of the PWB 10 is made through electrically conductive elements in the LGA interposer 23 that is interposed between them. In the example shown, the stack of LGA components—LGA module, interposer and PWB—is sandwiched between heatsink 24, which also provides cooling to the semiconductor chips 21a and 21b, and a backside stiffener plate 25. A thin insulating sheet 26 is commonly interposed between stiffener plate 25 and PWB 10 to prevent unwanted electrical contact with any circuits on the back surface of the PWB.

Load posts 27 pass through holes in the stiffener plate 25 and the PWB 10 and are in threaded engagement with heatsink 24. The other ends of the load posts 27 have a head or similar means for retaining the ends or corners of spring member 28. Turning an actuation screw 29, threaded through the center of spring member 28, allows a mechanical load of the desired level to be applied to the LGA stack. However, as FIG. 2 illustrates, load application may not be sufficient to ensure adequate and consistent LGA connector loads across the entire contact array if there is a significant variation in PWB thickness at the LGA site.

FIG. 3 is a schematic illustration of the of the same LGA load configuration shown in FIG. 2, but with the addition of the customizable insulating backer structure 30 of the present invention. Common elements having the same numerical designators require no further explanation. The elements that comprise the customizable insulator backer structure are a first insulating sheet 34, a second insulating sheet 32, and a customizable shaping layer 36 sandwiched between the first and second insulating sheets. The customizable insulating backer structure is interposed between the stiffener plate 25 and PWB 10 and provides the appropriate amount of PWB shape bias to compensate for PWB shape variations at the LGA site and facilitate uniform mechanical loading of the LGA connections.

Figure 4:
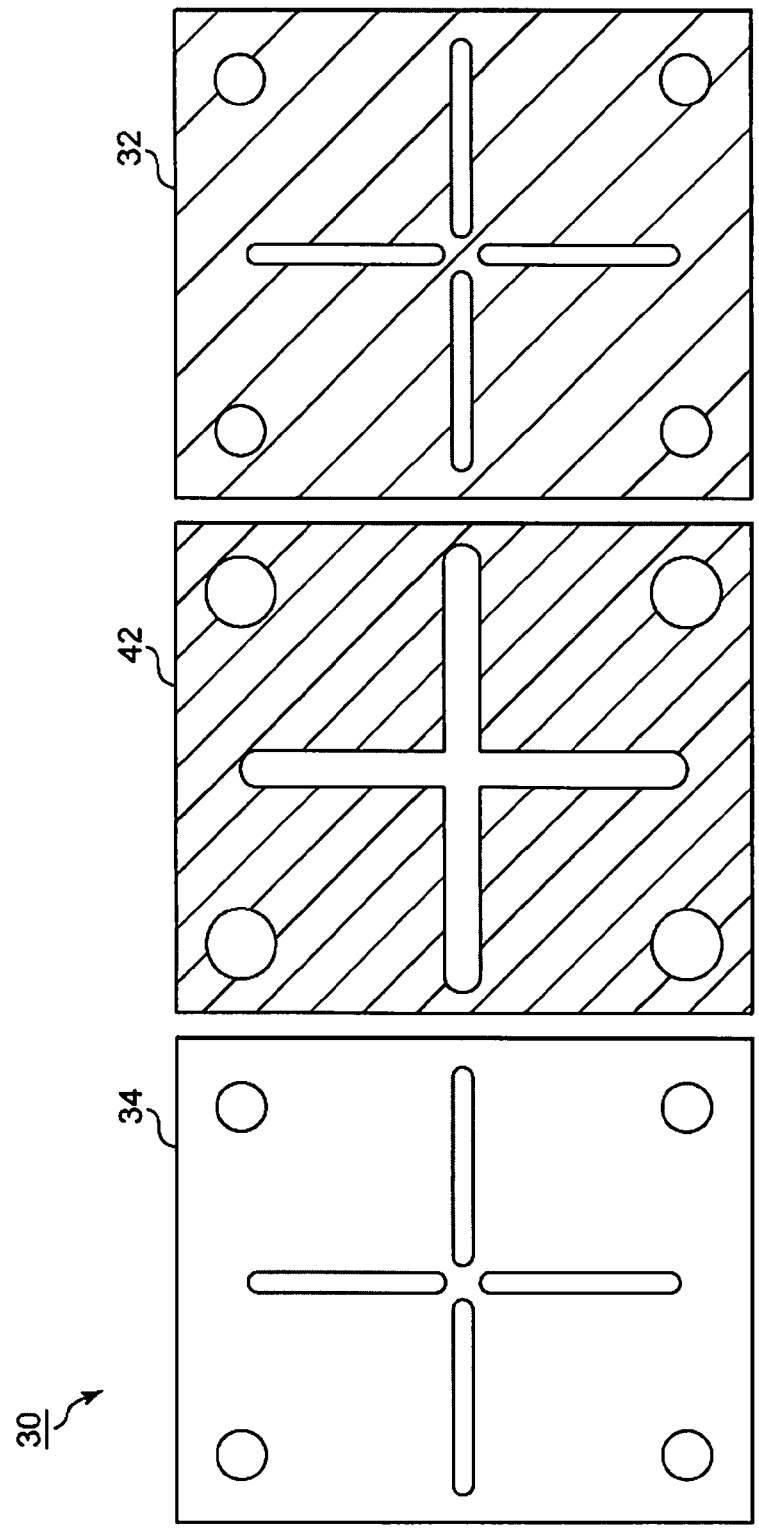
FIG. 4 illustrates the three layers of a customizable backer structure according to the present invention using a prepreg sheet.
Figure 5:
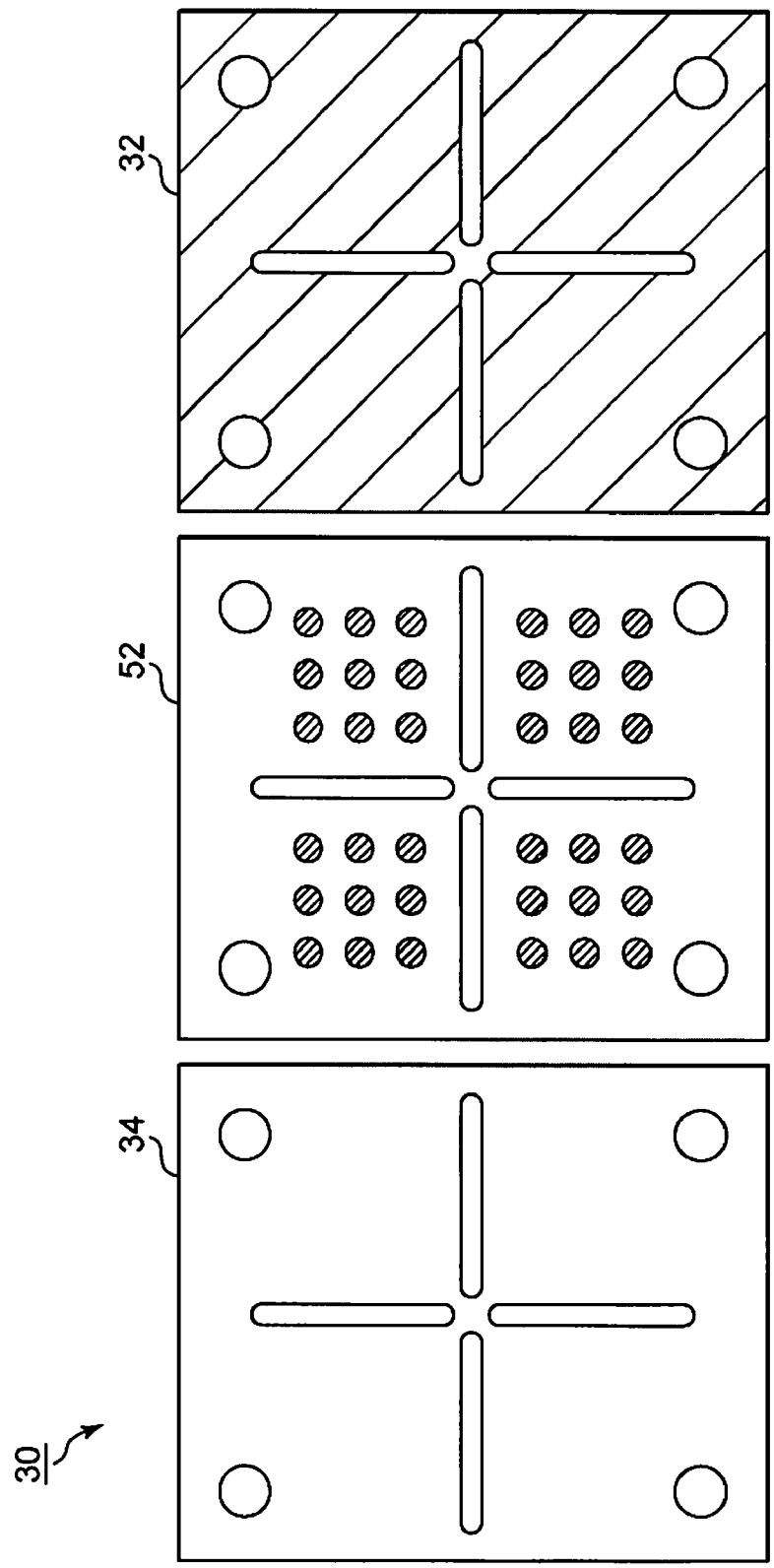
FIG. 5 illustrates the three layers of a customizable backer structure according to the present invention using a stencil applied adhesive.

The following explains in further detail how the customizable insulating backer structure of the present invention is formed. An electrically insulating, high flow, low temperature laminate prepreg 42 (see FIG. 4) or low temperature curable, stencil deposited organic adhesive, such as an epoxy, silicone, acrylate, or urethane based material 52 (see FIG. 5), is used and applied to electrically insulating film or organic sheet 34 predisposed atop the standard metal stiffener plate 25. Once this material is applied to the first insulating sheet 34, a stiffener/insulator sub-assembly is created, and it is then sandwiched with the second thin organic insulating sheet 32 that makes contact with the PWB backside during LGA hardware assembly. After assembly the LGA card/module assembly is exposed for a given time duration to a low temperature process regime (25° C.-150° C. depending on the material used) to facilitate flow and cure of the organic material between the first and second insulating sheets. After thermal exposure, the result is a rigid customized insulating backer that takes on the specific shape characteristics of individual board assemblies, as shown in FIG. 3.

This structure and process sequence eliminates PWB board yield losses, specialized assembly routings, and drastically improves LGA load uniformity on complex module-to-board interconnections. If PWB rework is required after assembly, the resultant backup structure is also readily removed from the PWB and can be reused with the PWB upon reassembly. The customizable insulator sandwich structure can also facilitate presence of backside components on the PWB if present within the LGA site.

Figure 6A:
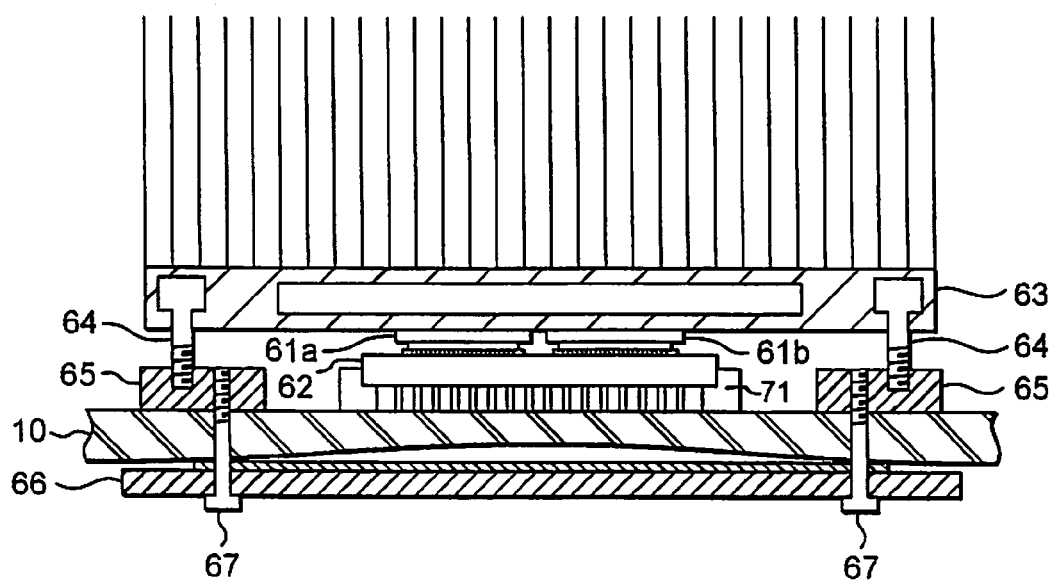
FIG. 6(a) illustrates the effect of a significant PWB thickness variation on a typical column grid array (CGA) load configuration.
Figure 6B:
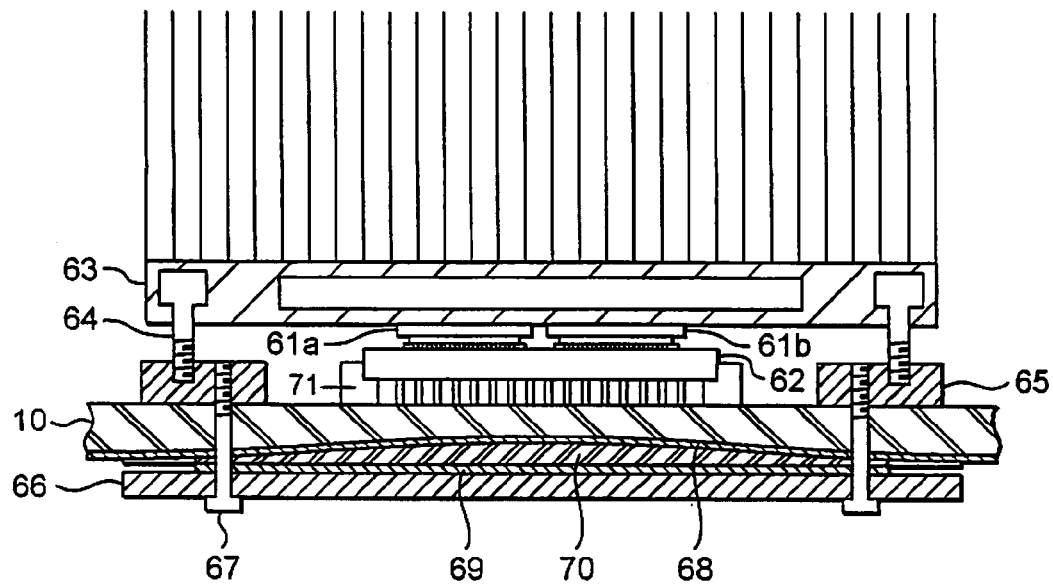
FIG. 6(b) illustrates the CGA load configuration of FIG. 6(a) with the addition of a customizable backer structure according to the present invention

It should be understood that the invention is not necessarily limited to the specific process, arrangement, materials and components shown and described above, but may be susceptible to numerous variations within the scope of the invention. For example, although the above-described exemplary aspects of the invention are believed to be particularly well suited for LGA connections, it is contemplated that the concepts of the presently disclosed customizable backer can be used in other applications as well, such as in conjunction with column grid array (CGA) and ball grid array (BGA) module packages possessing affixed heatsinks under load, in order to mitigate interconnection creep and board relaxation that can contribute to resultant load loss and strain build-up on critical thin bondline thermal interfaces. FIG. 6 discloses by way of example, a CGA connection in which a column grid array module comprised of semiconductor chips 61a and 61b, and carrier substrate 62 is mounted on PWB 10. Heat sink 63 is held in contact with the semiconductor chips by fasteners 64, which engage load frame 65. A stiffener plate 66 is held against the backside of PWB 10 by fasteners 67, which also engage load frame 65. Insulative plastic members 71 are inserted between and along two opposing edges of the carrier substrate 62 and the PWB 10 to eliminate gross crushing of CGA connections held under highly high compressive loads that are required to secure heat sink 63. As illustrated in FIG. 6(a), a variation in thickness of PWB 10 at the CGA connection site can lead to strain on the CGA connection as well as the thermal interface between the heatsink and the semiconductor chips. However, introduction of a customizable backer structure as shown in FIG. 6(b), comprised of a first insulating sheet 68, a second insulating sheet 69, and a customizable shaping layer 70, placed between the stiffener plate 66 and the PWB 10 in the manner earlier described, serves to minimize potential solder creep and board relaxation, and mitigate thermal interface bondline stress/strain buildup.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. An electrical contact assembly, comprising:
   a first module having a first set of electrical contacts;
   a second module having a first side with a second set of electrical contacts and a second side opposite the first side, the second set of electrical contacts being aligned with the first set of electrical contacts;
   a shape generating module arranged to impart a desired shape to the second side of the second module for urging the second set of electrical contacts toward the first set of electrical contacts, the shape generating module being comprised of a first insulating layer, a second insulating layer and a shape producing layer disposed between the first and second insulating layers, the shape producing layer producing the desired shape upon application of a heat treatment; and
   a clamping arrangement arranged to clamp the first module, the second module and the shape generating modules together,
   wherein the clamped assembly of the first module, the second module and the shaping module results in a positive contact force between the first and second sets of electrical contacts that is substantially uniform across the sets of electrical contacts,
   wherein the clamping arrangement includes a stiffening surface arranged such that the shape generating module is disposed between the stiffening surface and the second module, and
   wherein the stiffening surface urges the shaping module against the second module when the first module, the second module and the shaping module are clamped by the clamping arrangement.

2. The assembly of claim 1, wherein the first module comprises a multi-chip module.

3. The assembly of claim 1, wherein the second module comprises a printed wiring board.

4. The assembly of claim 1, further comprising:
   an intermediate module, having an interconnecting set of electrical contacts, disposed between the first module and the second module, so as to provide electrical connections between the first and second sets of electrical contacts.

5. The assembly of claim 4, wherein the first and second sets of electrical contacts are land grid arrays and the intermediate module comprises an interposer that provides electrical connections between the first and second sets of electrical contacts when the first module, intermediate module, second module and shaping module are clamped together by the clamping arrangement.

6. The assembly of claim 4, wherein the intermediate module comprises one of a ball grid array and a column grid array.

7. An electrical contact assembly, comprising:
a first module having a first set of electrical contacts;
a second module having a first side with a second set of electrical contacts and a second side opposite the first side, the second set of electrical contacts being aligned with the first set of electrical contacts;
a shape generating module arranged to impart a desired shape to the second side of the second module for urging the second set of electrical contacts toward the first set of electrical contacts, the shape generating module being comprised of a first insulating layer, a second insulating layer and a shape producing layer disposed between the first and second insulating layers, the shape producing layer producing the desired shape upon application of a heat treatment; and
a clamping arrangement arranged to clamp the first module, the second module and the shape generating modules together,
wherein the clamped assembly of the first module, the second module and the shaping module results in a positive contact force between the first and second sets of electrical contacts that is substantially uniform across the sets of electrical contacts,
wherein the shape producing layer is comprised of one of an insulating sheet pre-impregnated with an adhesive material, and a layer of adhesive material applied to the second insulating layer, and
wherein the adhesive material flows and cures between the first and second insulating layers upon application of the heat treatment.

8. A multi-chip module assembly comprising:
a layered assembly having a multi-chip module, a printed wiring board and a land grid array interconnect disposed therebetween, the multi-chip module, the printed wiring board and the land grid array interconnect having mating sets of electrical contacts;
means for clamping the layered assembly together; and
means for producing a desired shape in the printed wiring board such that clamping the layered assembly together results in a positive contact force between the mating sets of electrical contacts that is substantially uniform across the sets of electrical contacts, said means for producing a shape including a first insulating layer, a second insulating layer and a shape producing layer disposed between the first and second insulating layers,
wherein the shape producing layer produces the desired shape upon application of a heat treatment;
wherein the shape producing layer is comprised of one of an insulating sheet pre-impregnated with an adhesive material, and a layer of adhesive material applied to the second insulating layer, and
wherein the adhesive material flows and cures between the first and second insulating layers upon application of the heat treatment.

9. A multi-chip module assembly, comprising:
a layered assembly having a multi-chip module, a printed wiring board and a land grid array interconnect disposed therebetween, the multi-chip module, the printed wiring board and the land grid array interconnect having mating sets of electrical contacts;
means for clamping the layered assembly together; and
means for producing a desired shape in the printed wiring board such that clamping the layered assembly together results in a positive contact force between the mating sets of electrical contacts that is substantially uniform across the sets of electrical contacts, said means for producing a share including a first insulating layer, a second insulating layer and a shape producing layer disposed between the first and second insulating layers,
wherein the shape producing layer produces the desired shape upon application of a heat treatment;
wherein said means for clamping includes a means for stiffening arranged such that the means for producing the desired shape is disposed between the means for stiffening and the layered assembly, and
wherein the means for stiffening urges the means for producing the desired shape against the printed wiring board when the layered assembly is clamped by the means for clamping.

* * * * *